(12) United States Patent
Chang et al.

(10) Patent No.: US 7,785,972 B2
(45) Date of Patent: Aug. 31, 2010

(54) METHOD FOR FABRICATING SEMICONDUCTOR MOS DEVICE

(75) Inventors: Yu-Lan Chang, Kao-Hsiung (TW);
Chao-Ching Hsieh, Tai-Nan (TW);
Yi-Wei Chen, Tai-Chung Hsien (TW);
Tzung-Yu Hung, Tainan Hsien (TW);
Chun-Chieh Chang, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 590 days.

(21) Appl. No.: 11/463,007

(22) Filed: Aug. 8, 2006

(65) Prior Publication Data

US 2008/0038887 A1    Feb. 14, 2008

(51) Int. Cl.
*H01L 21/336* (2006.01)
(52) U.S. Cl. ............... 438/301; 438/305; 438/528; 257/E21.433

(58) Field of Classification Search ............. 438/301, 438/303, 305, 306, 528; 257/E21.336, E21.433
See application file for complete search history.

(56) References Cited

U.S. PATENT DOCUMENTS

| 6,372,566 | B1 * | 4/2002 | Kittl et al. ............... 438/206 |
| 7,211,516 | B2 * | 5/2007 | Chen et al ............... 438/682 |
| 2004/0132260 | A1 * | 7/2004 | Lenoble .................. 438/306 |

* cited by examiner

*Primary Examiner*—Michael Trinh
(74) *Attorney, Agent, or Firm*—Winston Hsu

(57) ABSTRACT

A method of making a transistor device having silicided source/drain is provided. A gate electrode is formed on a substrate with a gate dielectric layer therebetween. A spacer is formed on sidewalls of the gate electrode. A source/drain is implanted into the substrate. A pre-amorphization implant (PAI) is performed to form an amorphized layer on the source/drain. A post-PAI annealing process is performed to repair defects formed during the PAI process. A metal silicide layer is then formed from the amorphized layer.

17 Claims, 11 Drawing Sheets

METHOD FOR FABRICATING SEMICONDUCTOR MOS DEVICE

BACKGROUND OF THE INVENTION

1. Field of the Invention

The present relates generally to semiconductor MOS device fabrication. More particularly, the present invention relates to a silicide or salicide process utilizing pre-amorphization implant (PAI) and a low-temperature post-PAI annealing for repairing damage caused by the PAI.

2. Description of the Prior Art

Silicide or self-aligned silicide (salicide) process is well known in the art. FIGS. 1-4 shows a typical silicide process. As shown in FIG. 1, a gate 12 is formed on a substrate 10 with a gate oxide layer 14 interposed therebetween. An offset lining oxide layer 16 is typically formed on the sidewalls of the gate 12 and extends to the main surface of the substrate 10. A pair of silicon nitride spacers 18 is formed on the offset lining oxide layer 16. Source/drain extension regions 22 are formed directly under the silicon nitride spacers 18. After the formation of the silicon nitride spacers 18, dopants are implanted into the substrate 10 to form heavily doped source/drain regions 24.

After the formation of the heavily doped source/drain regions 24, as shown in FIG. 2, a pre-amorphization implant (PAI) 30 is then carried out to form an amorphized layer 32. PAI may be accomplished by implanting an amorphizing substance such as In or Ge into the substrate 10.

As shown in FIG. 3, a blanket metal layer 42 is then sputtered onto the substrate 10. Finally, as shown in FIG. 4, the metal layer 42 reacts with the substrate 10 and the gate 12 to form silicide layer 52. The un-reacted metal is then removed from the wafer surface by wet etching.

However, the PAI process causes damages to the surface of the substrate 10, resulting in interfacial defects 33 located at the interface between the amorphized layer 32 and the heavily doped source/drain regions 24 as specifically indicated in FIG. 2. A higher diode leakage between N+ source/drain region and P well is observed likely due to the formation of the interfacial defects 33.

In light of the above, there is a need to provide an improved method to fabricate a transistor with silicided source and drain without deteriorating the performance of the transistor.

SUMMARY OF THE INVENTION

The primary object of the present invention is to provide an improved method for fabricating a metal-oxide-semiconductor (MOS) transistor device in order to solve the above-mentioned problems.

According to the claimed invention, a method of making a transistor device having silicided source/drain is provided. A gate electrode is first formed on a substrate with a gate dielectric layer therebetween. A spacer is formed on sidewalls of the gate electrode. A source/drain is implanted into the substrate using the spacer as a mask. A pre-amorphization implant (PAI) is performed to form an amorphized layer on the source/drain. A post-PAI annealing process is carried out to repair defects formed during the PAI process. A metal layer is formed on the amorphized layer. A thermal process is carried out to make the metal layer react with the amorphized layer to form a metal silicide layer.

From one aspect of this invention, a method of fabricating a semiconductor MOS device is disclosed. A gate electrode is first formed on a substrate with a gate dielectric layer therebetween. A liner is formed on sidewalls of the gate electrode. Source/drain extensions are implanted into the substrate. A spacer is formed on the liner. A source/drain is implanted into the substrate. The source/drain is then activated. A pre-amorphization implant (PAI) process is performed to form an amorphized layer next to the spacer. A low-temperature post-PAI annealing process is performed to repair defects formed during the PAI process. After the low-temperature post-PAI annealing process, a metal layer is formed on the amorphized layer. A thermal process is carried out to make the metal layer react with the amorphized layer to form a metal silicide layer.

These and other objectives of the present invention will no doubt become obvious to those of ordinary skill in the art after reading the following detailed description of the preferred embodiment that is illustrated in the various figures and drawings.

DETAILED DESCRIPTION

The present invention is directed to a silicide process utilizing pre-amorphization implant (PAI) and a low-temperature post-PAI annealing for restoring damage caused by the PAI.

Figure 1:
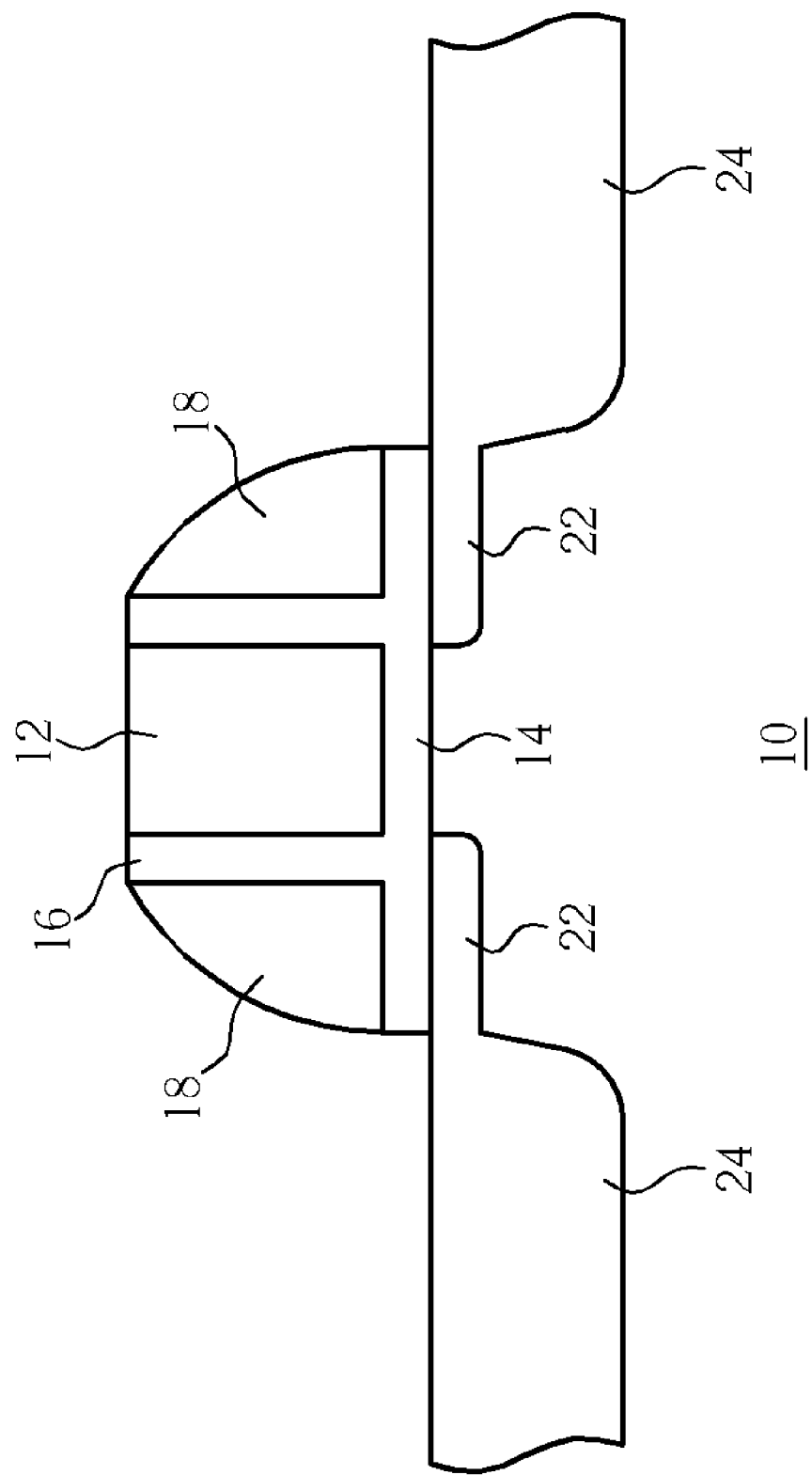
FIGS. 1-4 are schematic, cross-sectional diagrams showing the suicide process according to the prior art method.
Figure 2:
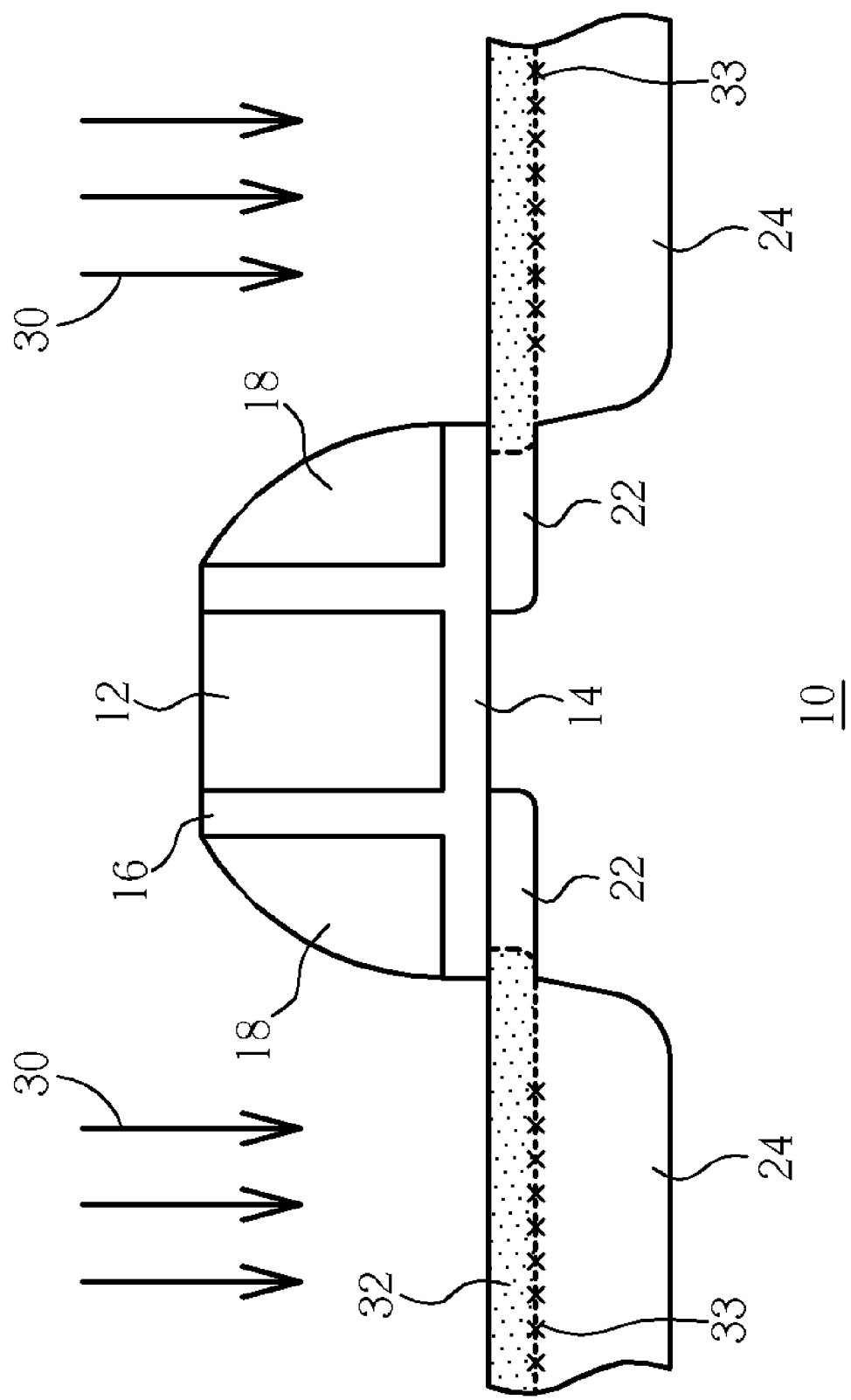
Figure 3:
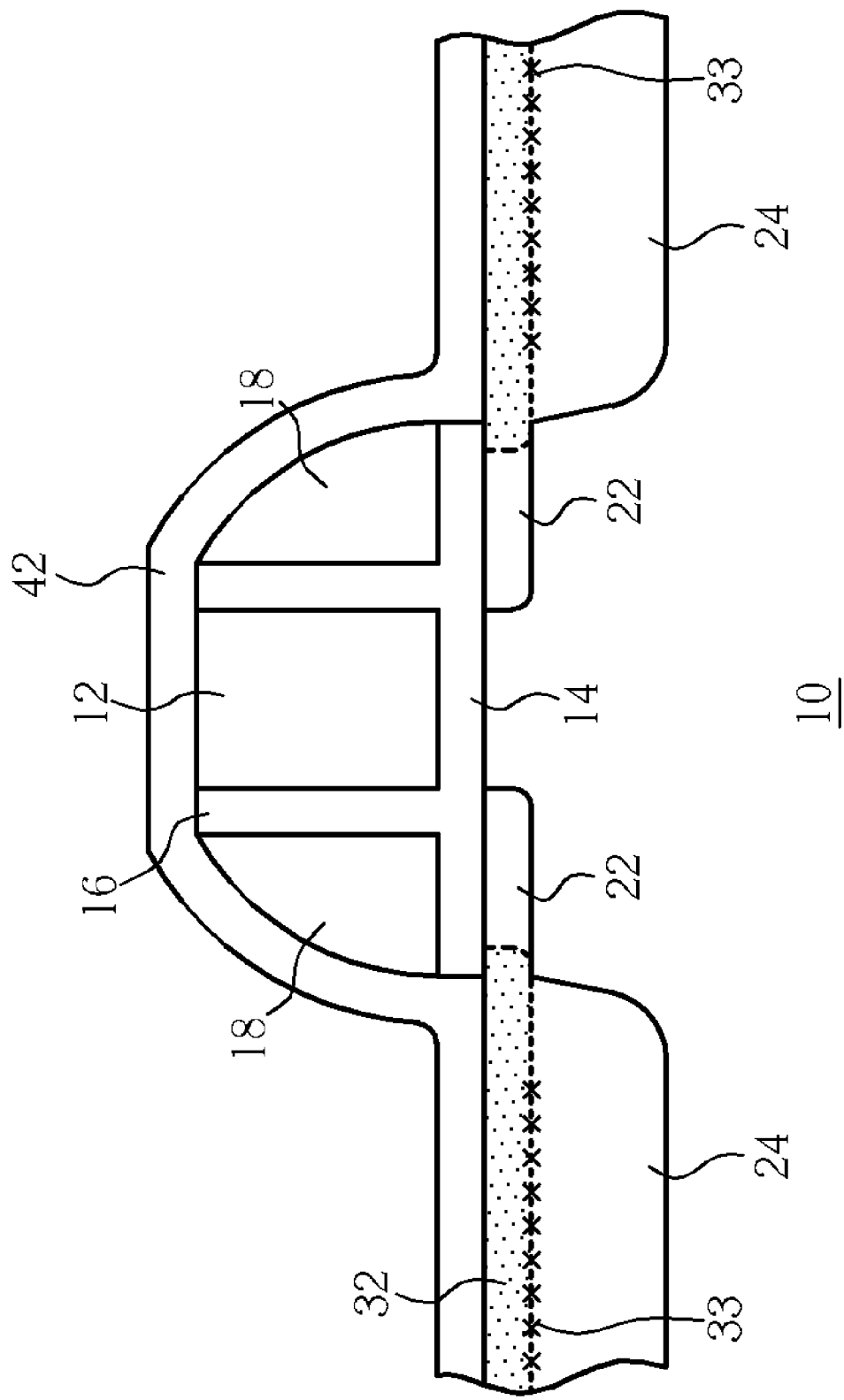
Figure 4:
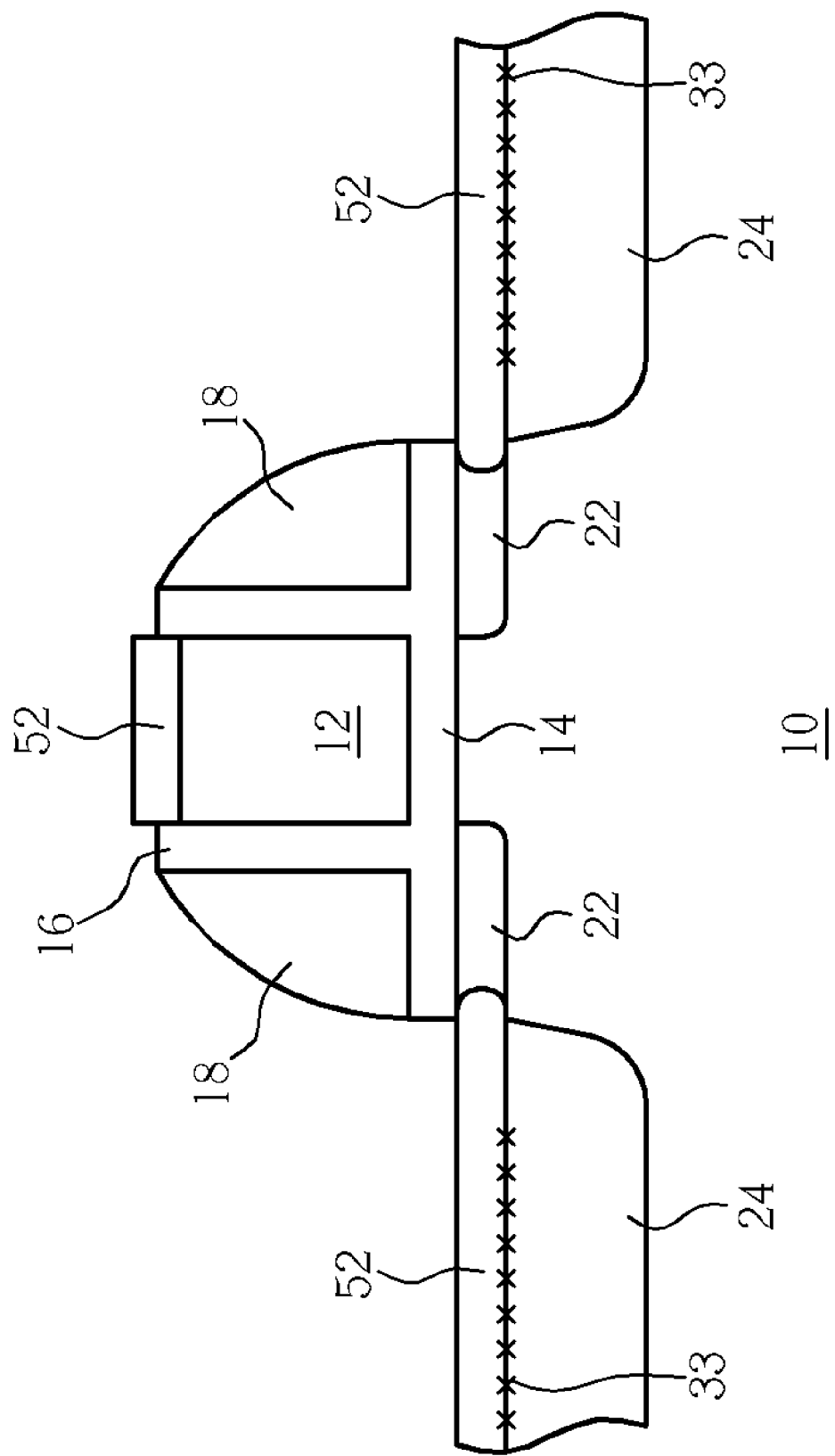
Figure 5:
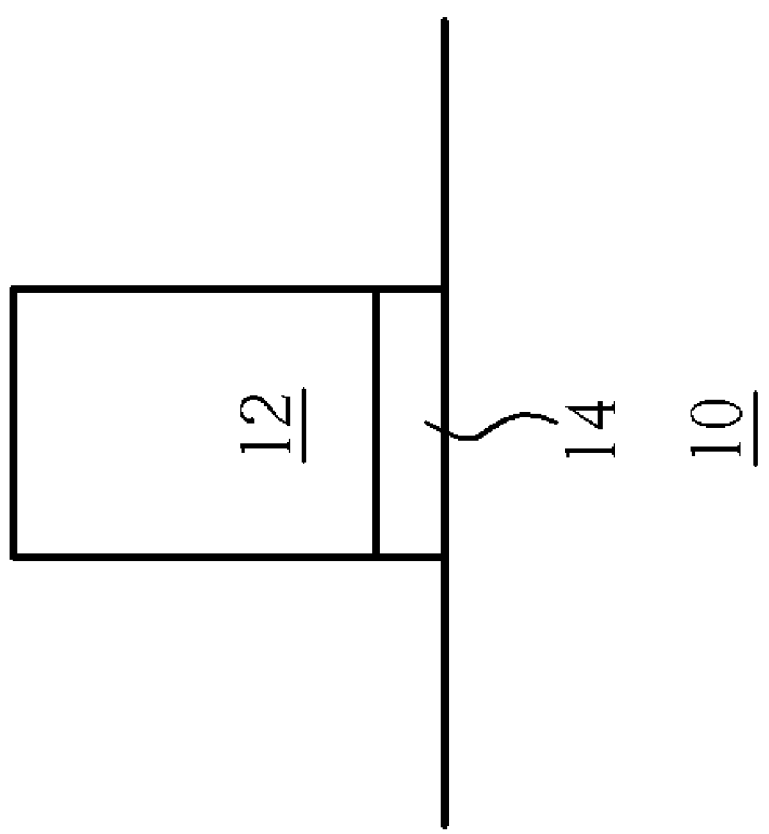
FIGS. 5-11 are schematic, cross-sectional diagrams showing one preferred embodiment of the present invention.

FIGS. 5-11 are schematic, cross-sectional diagrams showing the improved silicide process according to one preferred embodiment of the present invention. As shown in FIG. 5, a gate electrode 12 is formed on a substrate 10 such as a silicon substrate, silicon-on-insulator (SOI) substrate or SiGe substrate, with a gate oxide layer 14 therebetween.

Figure 6:
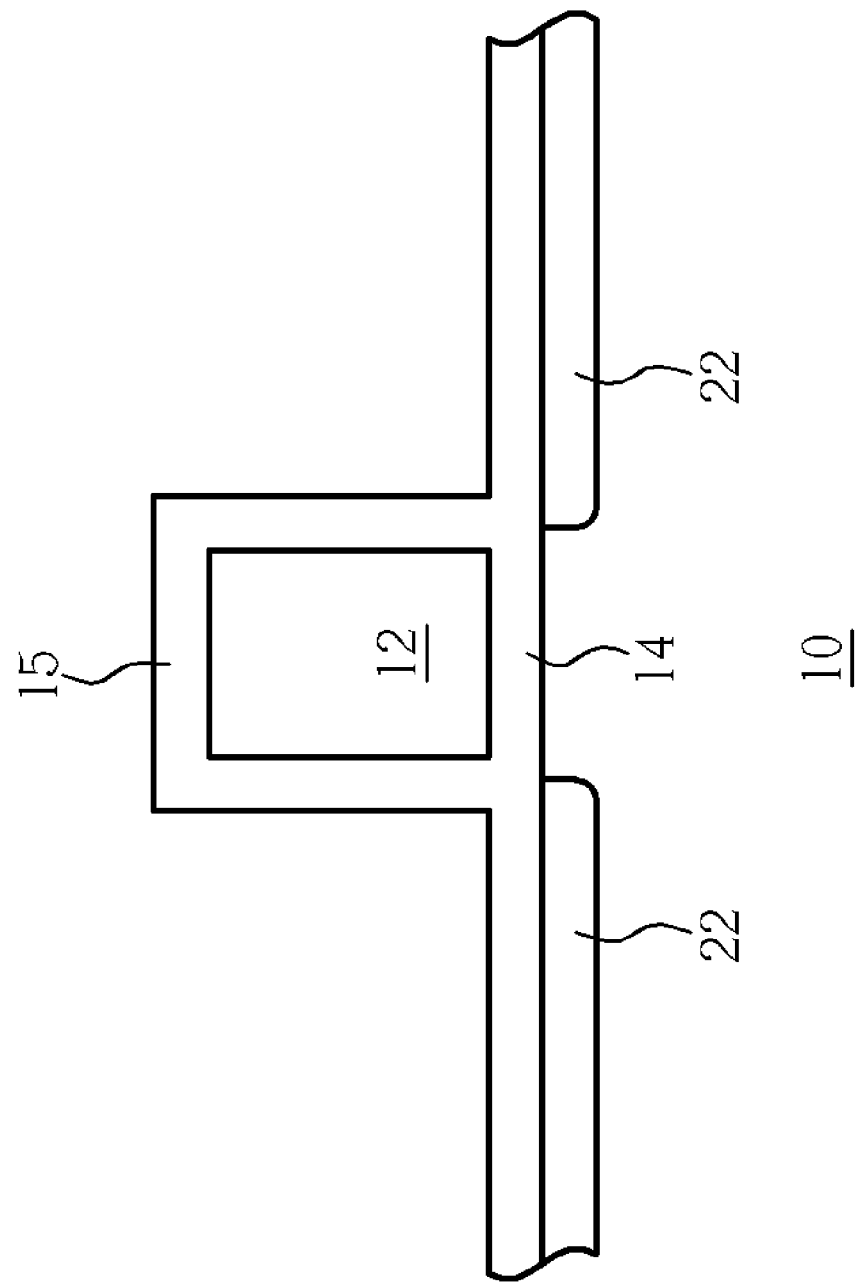

As shown in FIG. 6, a lining layer 15, preferably, silicon dioxide, is then deposited over the top surface and sidewalls of the gate electrode 12, and on the surface of the substrate 10. The thickness of the lining layer 15 typically ranges between 50 angstroms and 400 angstroms, but not limited thereto. An ion implantation process is then carried out to implant dopant species such as phosphorus, arsenic or antimony into the substrate 10 so as to form source/drain extension regions 22.

Figure 7:
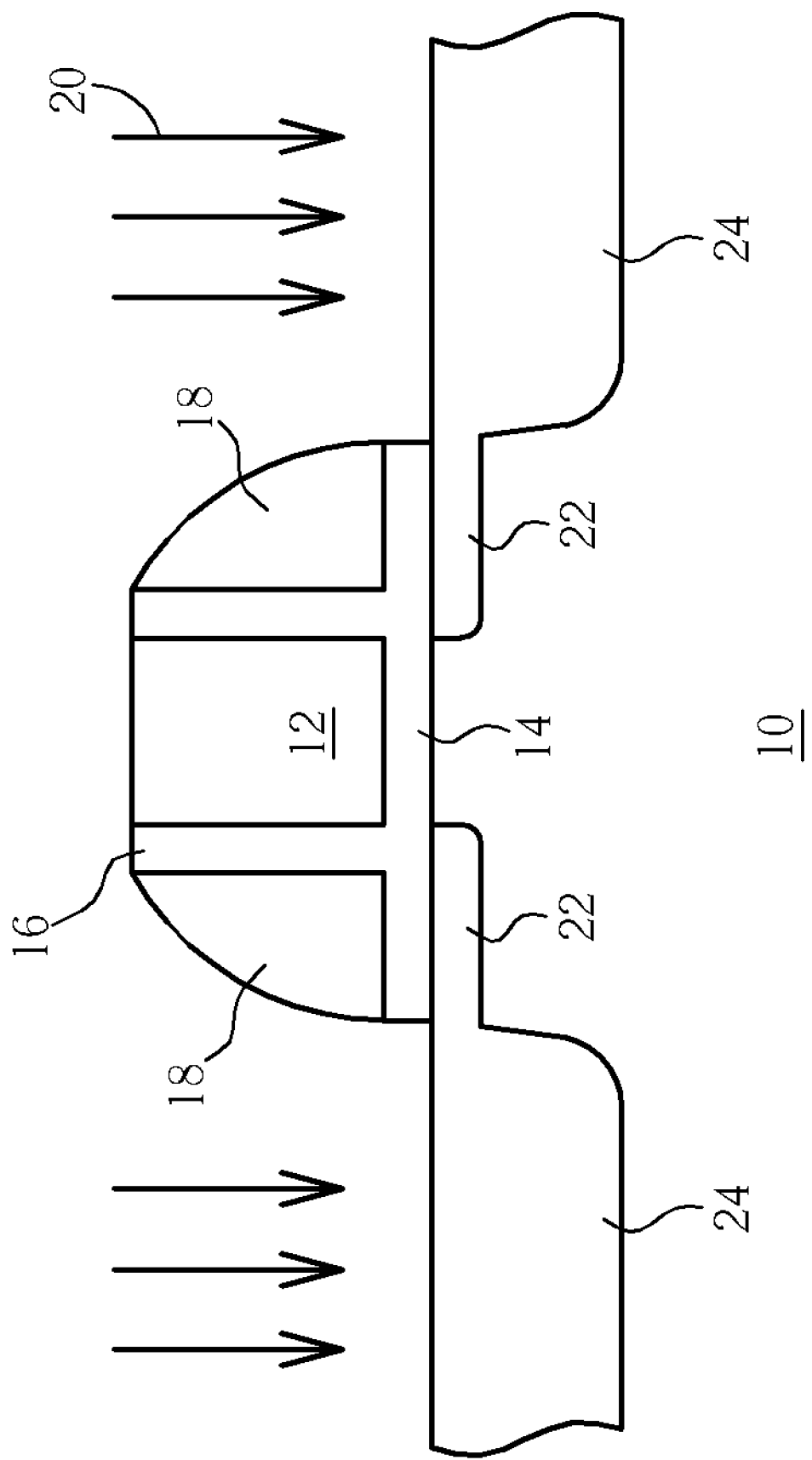

As shown in FIG. 7, a blanket layer of silicon nitride (not shown) is deposited on the lining layer 15. An anisotropic dry etching is then carried out to etch the silicon nitride layer and the lining layer 15, thereby forming a pair of silicon nitride spacers 18 and L-shaped liner layer 16 on the sidewalls of the gate electrode 12. Subsequently, a high-dosage ion implantation 20 is conducted to form deep source/drain regions 24 in the substrate 10. The sidewall spacers 18 and gate electrode 12 act as a mask, which protect source/drain extension regions 22 from being heavily doped. After the formation of the deep source/drain regions 24, dopants in the deep source/drain regions 24 are then activated using an anneal process. During this annealing process, the amorphized silicon surface of the deep source/drain regions 24 formed due to the source/drain ion implantation is re-crystallized.

Figure 8:
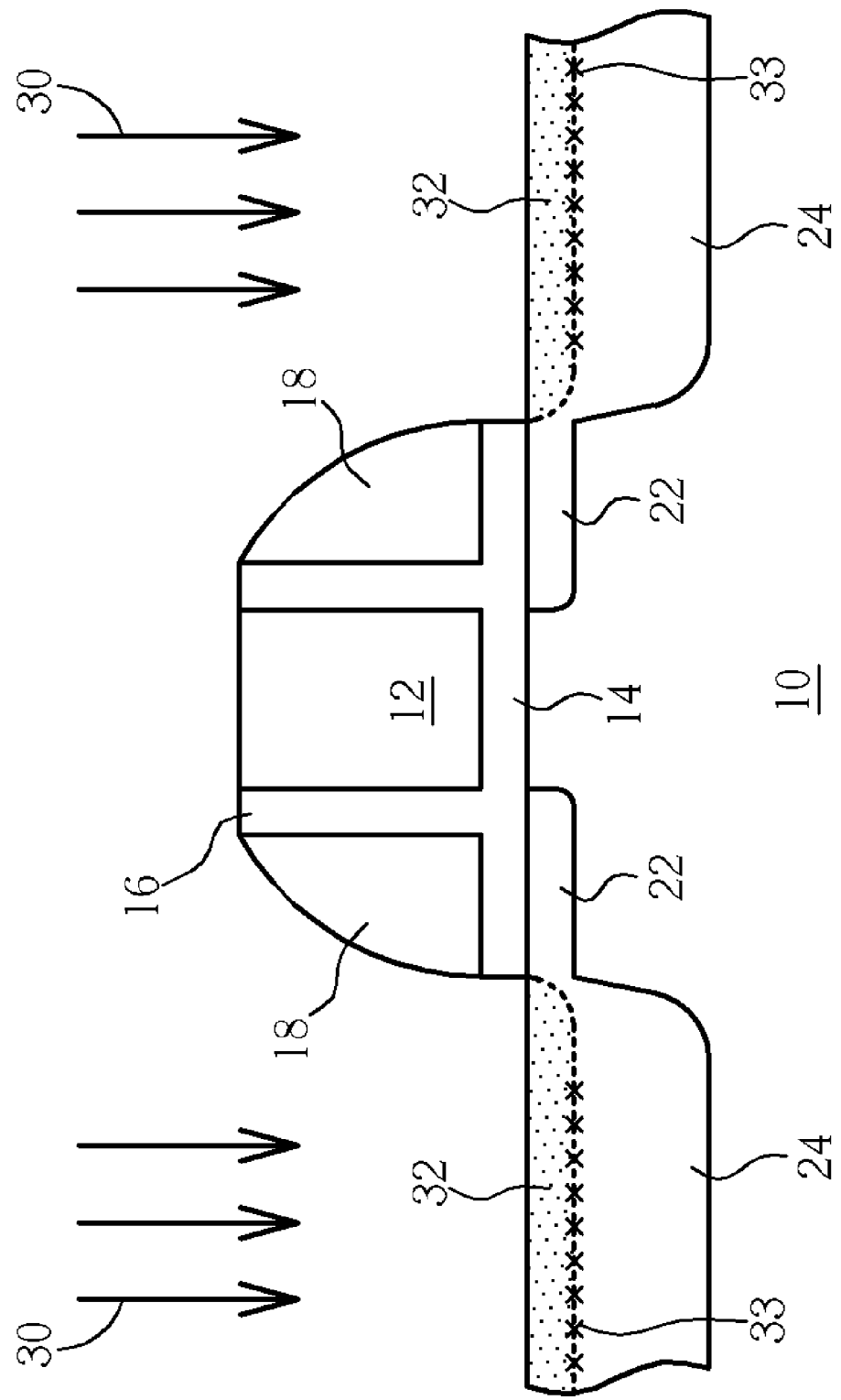

As shown in FIG. 8, a wet pre-clean process is conducted to remove unwanted substances such as particles or native oxide from the substrate surface. After the wet pre-clean process, a PAI process is conducted to form an amorphized layer 32. The PAI process is accomplished by implanting an amorphizing substance such as In, Ge, Xe or Ar into the substrate 10, which may be optionally carried out at a tilt angle (i.e., the direction of the incident amorphizing ion beam is not normal to the main surface of the substrate or wafer). In another case, the wet pre-clean may be carried out after the PAI process. Inevitably, PAI causes damages to the surface of the substrate 10, resulting in interfacial defects 33 at the interface between the amorphized layer 32 and the heavily doped source/drain regions 24.

Figure 9:
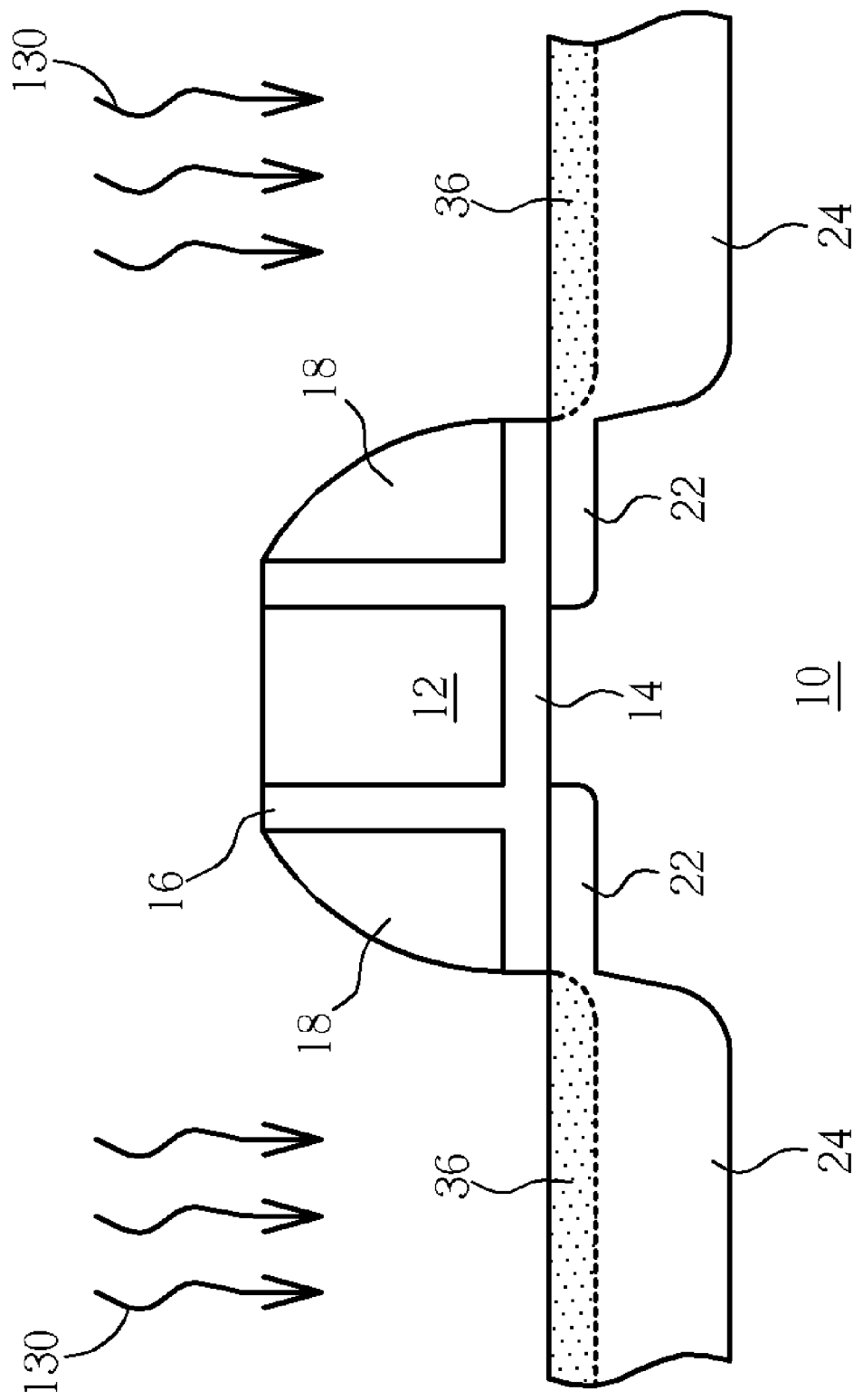

As shown in FIG. 9, a low-temperature post-PAI annealing 130 is performed to repair the interfacial defects 33 at the interface between the amorphized layer 32 and the heavily doped source/drain regions 24. According to the preferred embodiment, the low-temperature post-PAI annealing is preferably performed at a temperature ranging between 400° C. and 800° C. A higher temperature exceeding 800° C. might transform the amorphized layer 32 back to crystalline form. The duration of the low-temperature post-PAI annealing is preferably between 0-60 seconds.

The aforesaid post-PAI operated at relatively low temperature range can solve the above-described diode leakage problem while not affecting the device performance. For example, it has been experimentally proven that the $I_{on}/I_{off}$ of P type field effect transistor (PFET) is not degraded when the low-temperature post-PAI annealing is incorporated.

The post-PAI annealing 130 may be rapid thermal processes or spike annealing process. Alternatively, the post-PAI annealing 130 may be replaced with laser anneal, plasma anneal or ultraviolet (UV) anneal methods.

Figure 10:
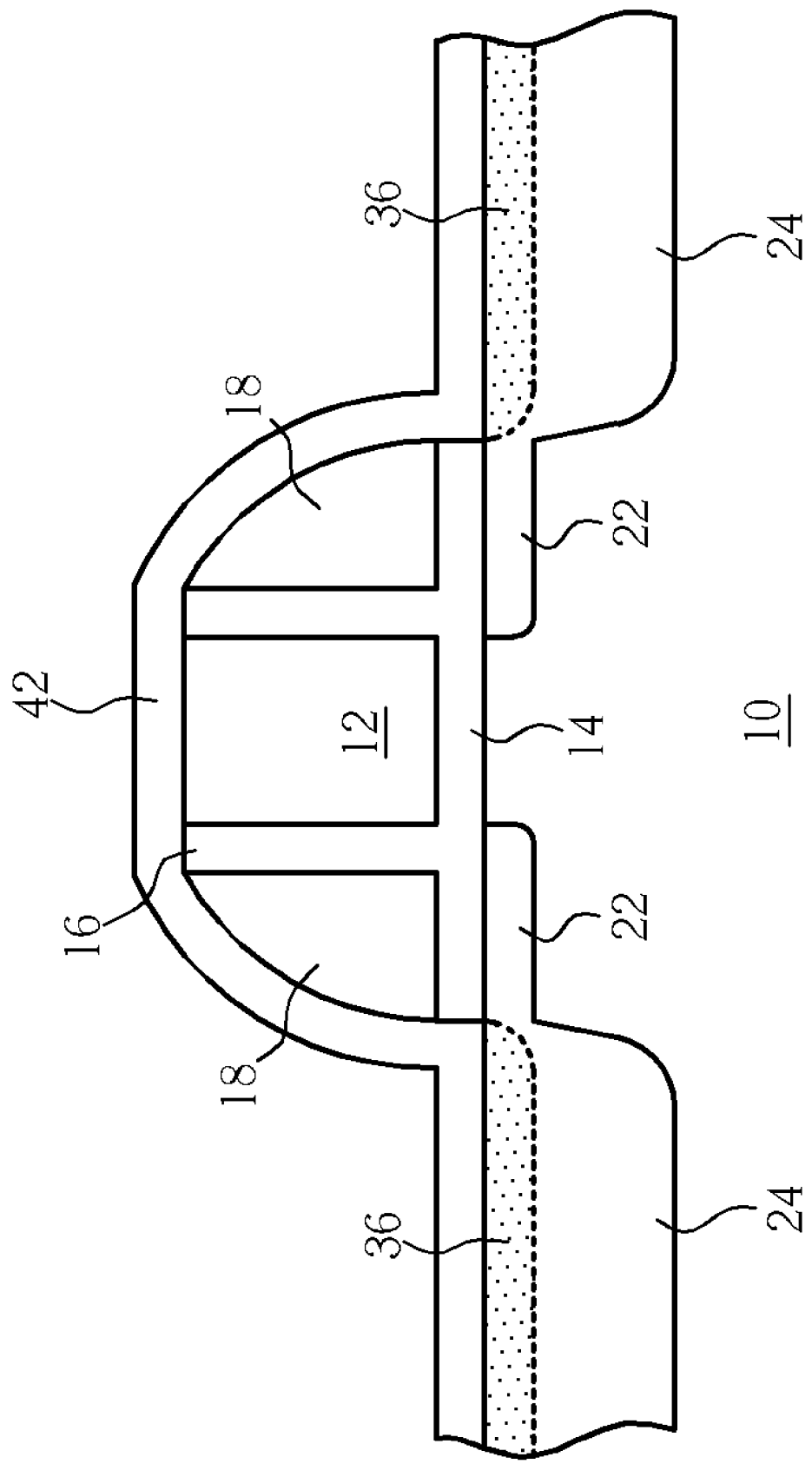

As shown in FIG. 10, a metal layer 42 such as cobalt, titanium, nickel, platinum, palladium, molybdenum or any alloy thereof is then blanket sputtered onto the substrate 10. An illustrative example of a process capable of depositing nickel layer is physical vapor deposition (PVD) from a nickel target. Preferably, the thickness of the metal layer 42 ranges between 50 and 200 angstroms, more preferably, between 100 and 180 angstroms.

Figure 11:
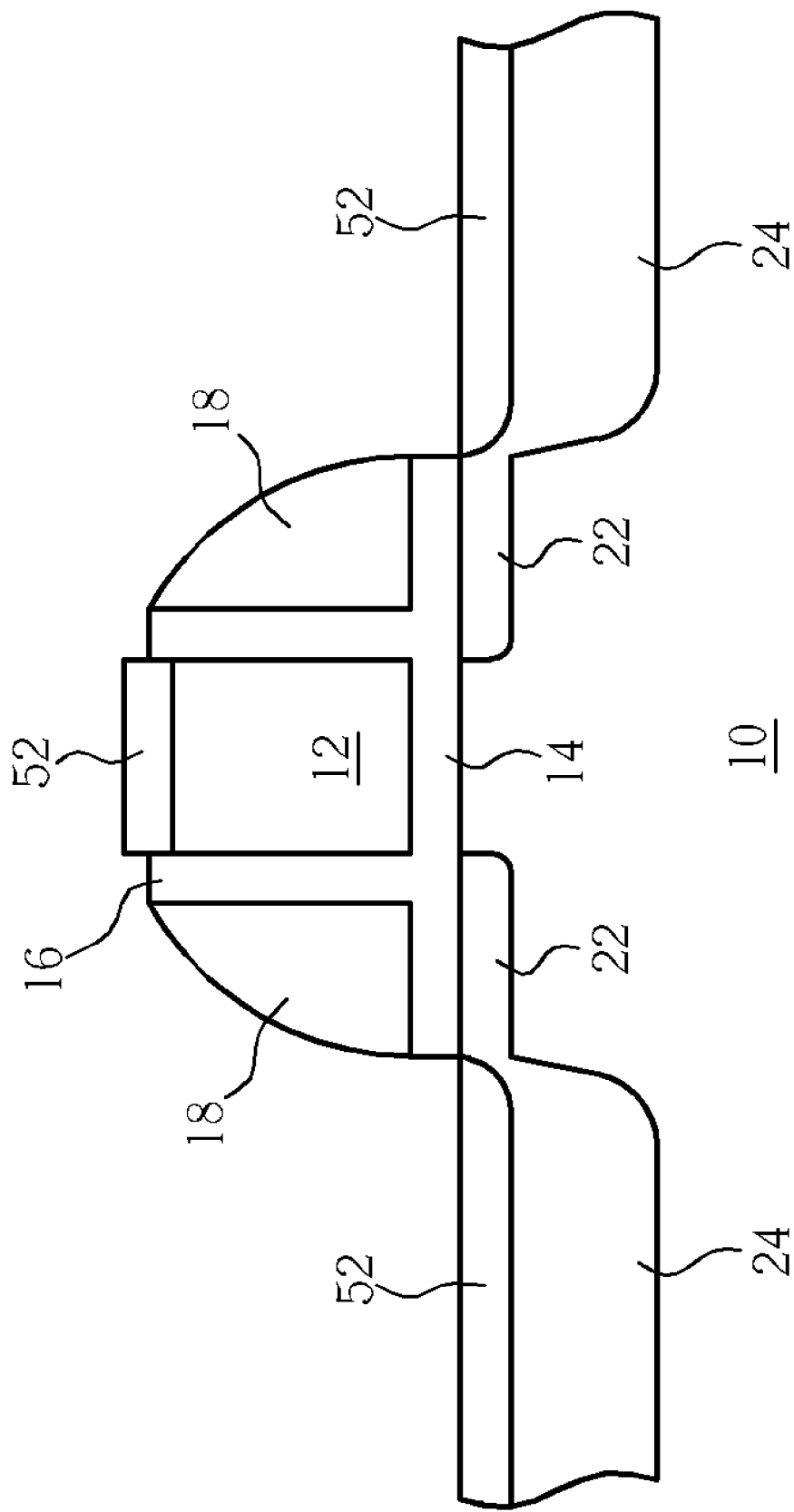

As shown in FIG. 11, the metal layer 42 reacts with the amorphized layer 32 and the gate electrode 12 to form silicide layer 52 such as nickel silicide (NiSi). The un-reacted metal is then removed from the wafer surface by wet etching. For example, the un-reacted nickel can be removed using a wet chemistry containing sulfuric peroxide mixture H2SO4:H2O2 (3:1) with deionized water, which preferably exhibits high selectivity for the un-reacted metal relative to the silicide layer 52.

In some embodiments, after removing the un-reacted metal, a rapid thermal annealing (RTA) may be carried out to change the phase of the silicide layer 52.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor MOS device, comprising:
   forming a gate electrode on a substrate with a gate dielectric layer therebetween;
   forming a liner on sidewalls of the gate electrode;
   implanting a source/drain extensions into the substrate;
   forming a spacer on the liner;
   implanting a source/drain into the substrate;
   activating the source/drain by using an annealing process;
   after activating the source/drain, performing a pre-amorphization implant (PAI) process to form an amorphized layer next to the spacer;
   performing a low-temperature post-PAI annealing process;
   after the low-temperature post-PAI annealing process, forming a metal layer on the amorphized layer; and
   reacting the metal layer with the amorphized layer to form a metal silicide layer thereto.

2. The method according to claim 1 wherein the gate dielectric layer comprises silicon oxide.

3. The method according to claim 1 wherein the liner comprises silicon oxide.

4. The method according to claim 1 wherein the spacer is a silicon nitride spacer.

5. The method according to claim 1 wherein the source/drain is activated using an annealing process which re-crystallize the source/drain.

6. The method according to claim 1 wherein the metal layer comprises nickel, platinum, palladium, molybdenum, or any alloy thereof.

7. The method according to claim 1 wherein the low-temperature post-PAI annealing process is carried out at a temperature ranging between 400° C. and 800° C.

8. The method according to claim 1 wherein duration of the low-temperature post-PAI annealing process ranges between 0-60 seconds.

9. The method according to claim 1 wherein the substrate comprises silicon substrate or SiGe substrate.

10. The method according to claim 1 wherein the low-temperature post-PAI annealing process comprises rapid thermal anneal (RTP), spike anneal, laser anneal, plasma anneal and UV anneal.

11. A method of making a transistor device having silicided source/drain, comprising:
    forming a gate electrode on a substrate with a gate dielectric layer therebetween;
    forming a spacer on sidewalls of the gate electrode;
    implanting a source/drain into the substrate;
    activating the source/drain by using an annealing process;
    after activating the source/drain, performing a pre-amorphization implant (PAI) to form an amorphized layer on the source/drain;
    performing a post-PAI annealing process;
    after the post-PAI annealing process, forming a metal layer on the amorphized layer; and
    reacting the metal layer with the amorphized layer to form a metal silicide layer thereto.

12. The method according to claim 11 wherein the metal layer comprises nickel, platinum, palladium, molybdenum, or any alloy thereof.

13. The method according to claim 11 wherein the spacer is a silicon nitride spacer.

14. The method according to claim 11 wherein the post-PAI annealing process is carried out at a temperature ranging between 400° C. and 800° C.

15. The method according to claim 11 wherein duration of the post-PAI annealing process ranges between 0-60 seconds.

16. The method according to claim 11 wherein the substrate comprises silicon substrate or SiGe substrate.

17. The method according to claim 11 wherein the post-PAI annealing process comprises rapid thermal anneal (RTP), spike anneal, laser anneal, plasma anneal and UV anneal.

* * * * *